(12) United States Patent
Lu et al.

(10) Patent No.: US 8,738,271 B2
(45) Date of Patent: May 27, 2014

(54) ASYMMETRIC WAVELET KERNEL IN SUPPORT VECTOR LEARNING

(75) Inventors: Zhao Lu, Auburn, AL (US); Jing Sun, Superior Township, MI (US); Kenneth R. Butts, Grosse Pointe Woods, MI (US)

(73) Assignees: Toyota Motor Engineering & Manufacturing North America, Inc., Erlanger, KY (US); The Regents of the University of Michigan, Ann Arbor, MI (US)

( * ) Notice: Subject to any disclaimer, the term of this patent is extended or adjusted under 35 U.S.C. 154(b) by 338 days.

(21) Appl. No.: 13/327,925

(22) Filed: Dec. 16, 2011

(65) Prior Publication Data

US 2013/0158840 A1    Jun. 20, 2013

(51) Int. Cl.
| | |
|---|---|
| *F02D 41/26* | (2006.01) |
| *F02D 41/00* | (2006.01) |
| *F02D 41/24* | (2006.01) |
| *G06F 17/50* | (2006.01) |

(52) U.S. Cl.
CPC ............ *F02D 41/00* (2013.01); *F02D 41/2425* (2013.01); *G06F 17/5095* (2013.01)
USPC ............................... 701/103; 123/480; 703/2

(58) Field of Classification Search
CPC ..... F02D 41/00; F02D 41/2425; F02D 41/24; F02D 41/1405; F02D 41/26; G06F 17/5095
USPC .............. 123/90.15, 399, 435, 480, 486, 488; 701/102, 103, 104, 105; 703/2, 8
See application file for complete search history.

(56) References Cited

U.S. PATENT DOCUMENTS

| | | | |
|---|---|---|---|
| 6,134,344 | A | 10/2000 | Burges |
| 6,961,719 | B1 | 11/2005 | Rai |
| 7,054,735 | B2 | 5/2006 | Masuda et al. |
| 7,220,214 | B2 | 5/2007 | Iwamoto et al. |
| 7,899,652 | B2 | 3/2011 | Lu et al. |
| 2002/0091471 | A1 | 7/2002 | Suzuki |
| 2005/0149234 | A1 | 7/2005 | Vian et al. |
| 2005/0261837 | A1 | 11/2005 | Wegerich et al. |

OTHER PUBLICATIONS

Mangasarian et al., "Large Scale Kernel Regression Via Linear Programming"; Data Mining Institute Technical Report 99-02, Aug. 1999, Machine Learning 46(1/3), 255-269, Jan. 2002.
Tsuda, K., "Support Vector Classifier with Asymmetric Kernel Functions," ESANN' 1999 proceedings—European Symposium on Artificial Neural Networks Bruges (Belgium), Apr. 21-23, 1999, pp. 183-188.
Vong, C. et al, "Modeling of Modern Automotive Petrol Engine Performance Using Support Vector Machines", J. Zhejiang Univ., SCI 2005 6A(1): 1-8.

(Continued)

*Primary Examiner* — Hai Huynh
(74) *Attorney, Agent, or Firm* — Gifford, Krass, Sprinkle, Anderson & Citkowski, P.C.

(57) ABSTRACT

Example methods of modeling a nonlinear dynamical system such as a vehicle engine include providing a model using linear programming support vector regression (LP-SVR) having an asymmetric wavelet kernel, such as derived from a raised-cosine wavelet function. The model may be trained to determine parallel model parameters while in a series-parallel configuration, and operated in the parallel configuration allowing improved and more flexible model performance. An improved engine control unit may use an LP-SVR with an asymmetric wavelet kernel.

14 Claims, 4 Drawing Sheets

(56) References Cited

OTHER PUBLICATIONS

Vong, C. et al., "Prediction of automotive engine power and torque using least squares support vector machines and Bayesian inference", *Engineering Applications of Artificial Intelligence*, 19 (200), p. 277-287.

Wu et al., "Asymmetric Kernel Learning", Microsoft Research Technical Report, Jun. 22, 2010.

Yao, C.-C., et al., "Fuzzy regression based on asymmetric support vector machines," *Applied Mathematics and Computation*, 182 (2006), 175-193.

Lu, Z., et al., "Linear programming SVM-ARMA$_{2K}$ with application in engine system identification," *IEEE Trans. Automation Science and Engineering*, 8(4), 846-854 (2011).

Martinez-Ramon, M., et al. "Support vector machines for nonlinear kernel ARMA system identification," *IEEE Trans. Neural Networks*, 17: 1617-1622, 2006.

ASYMMETRIC WAVELET KERNEL IN SUPPORT VECTOR LEARNING

FIELD OF THE INVENTION

The present invention relates to nonlinear dynamical systems identification and modeling.

BACKGROUND OF THE INVENTION

Models of dynamical systems are of great importance in almost all fields of science and engineering and specifically in control, signal processing and information science. Most systems encountered in the real world are nonlinear and in many practical applications nonlinear models are required to achieve an adequate modeling accuracy.

Linear programming support vector regression using a wavelet kernel is discussed in U.S. Pat. No. 7,899,652 to Lu, et al. However, improved approaches to model determination for a nonlinear dynamical system are useful for numerous applications, in particular in relation to identifying the parallel model of a nonlinear dynamical system.

SUMMARY OF THE INVENTION

Examples of the present invention include a nonlinear support vector machine using an asymmetric wavelet kernel. In some examples, the asymmetric wavelet kernel is based on a raised-cosine function.

A novel asymmetric wavelet kernel function was developed for identifying the parallel model of a dynamical system using an external dynamicals training strategy. An asymmetric wavelet kernel was found to be excellent for developing the parallel model of a dynamical system. Simulations using a benchmark robot min dataset demonstrate the superiority of the novel asymmetric wavelet kernel function in capturing the transient component of signals.

Examples of the present invention include a support vector machine using a linear programming algorithm and a novel asymmetric wavelet kernel function. In some examples, the parallel model of a nonlinear dynamical system is identified. Some examples use the linear programming algorithm SVM-ARMA$_{2K}$. Linear programming combined with an asymmetric wavelet kernel function allows improved and more reliable identification of the parallel model of a nonlinear dynamical system.

A series-parallel model input includes a previous system output state and the system input state. Inclusion of the previous system output state tends to stabilize the model prediction. In contrast, the parallel model input includes the previous model output state and the system input state. Parallel model outputs are prone to rapidly diverge from the actual system values. However, a parallel model offers greater flexibility and practical advantages over a series-parallel model, as operation of the model does not rely on receiving the system outputs. Hence, a parallel model is extremely valuable when a reliable model of system performance is required, particularly when system output state data is either not reliably available, or only available at larger time intervals than used in the model.

Examples of the present invention solve the problem of identifying the parallel model of a nonlinear dynamical system, which has been one of the most important technical challenges in the realm of nonlinear systems identification. Parallel model identification is much more unwieldy and complicated than the identification of series-parallel model.

Applications include an improved control unit for a complex physical system, such as an improved electronic control unit (ECU) for a vehicle engine, the SVM providing a model of engine performance. In some examples, the model is trained in a series-parallel configuration, and used in a parallel configuration. An SVM (support vector machine) is an alternative term for the SVR model.

DETAILED DESCRIPTION OF THE INVENTION

Examples of the present invention include novel approaches to system identification, such as identification of the parallel model of a nonlinear dynamical system. An example model identification strategy uses a linear programming algorithm, such as the LP-SVM-ARMA$_{2K}$ algorithm, with an asymmetric wavelet kernel, such as a raised cosine wavelet kernel. In some examples, a composite kernel is used, including the asymmetric wavelet kernel.

A model used in the parallel configuration may be trained in the series-parallel configuration. Due to the high complexity involved in the simultaneous estimation of the model states and parameters for identification in parallel model configuration, an external dynamicals strategy was used for identifying the parallel models of nonlinear dynamical systems. A model can be trained in a series-parallel configuration and then operated in the parallel configuration. The novel kernel functions described herein prevented diverging results and reduced parallel model error.

An example asymmetric wavelet kernel was induced from a type-II raised-cosine wavelet function, and used for identifying the parallel model of a nonlinear dynamical system. Raised cosine wavelet kernels are useful in multi-resolution nonlinear systems identification, and are useful for model identification for many applications. A composite kernel, for example including an asymmetric wavelet kernel, allows characterization of the different roles that filtered input and output play in driving the system.

Almost all known orthonormal wavelets, except for the Haar and the Shannon (the sine function), cannot be expressed in closed form or in terms of simple analytical functions, such as the sine, cosine, exponentials, and polynomials. Instead, they can only be expressed as the limit of a sequence or the integral of some functions. Previously used kernel functions for support vector learning are almost all symmetric, and the kernel functions used for quadratic programming support vector learning must be positive definite.

Herein, as a new trail blazed, the type-II raised cosine wavelet function is adopted to construct an innovative asymmetric wavelet kernel, which breaks the conventional restrictions of symmetry and positive-definiteness on commonly used kernel functions, and demonstrates superiority in translating the LP-SVM-ARMA$_{2K}$ model trained in series-parallel configuration, into a parallel model.

Further Discussion of Parallel and Series-Parallel Models

The identification model for a dynamical system can be categorized as a series-parallel model or a parallel model.

Figure 4:
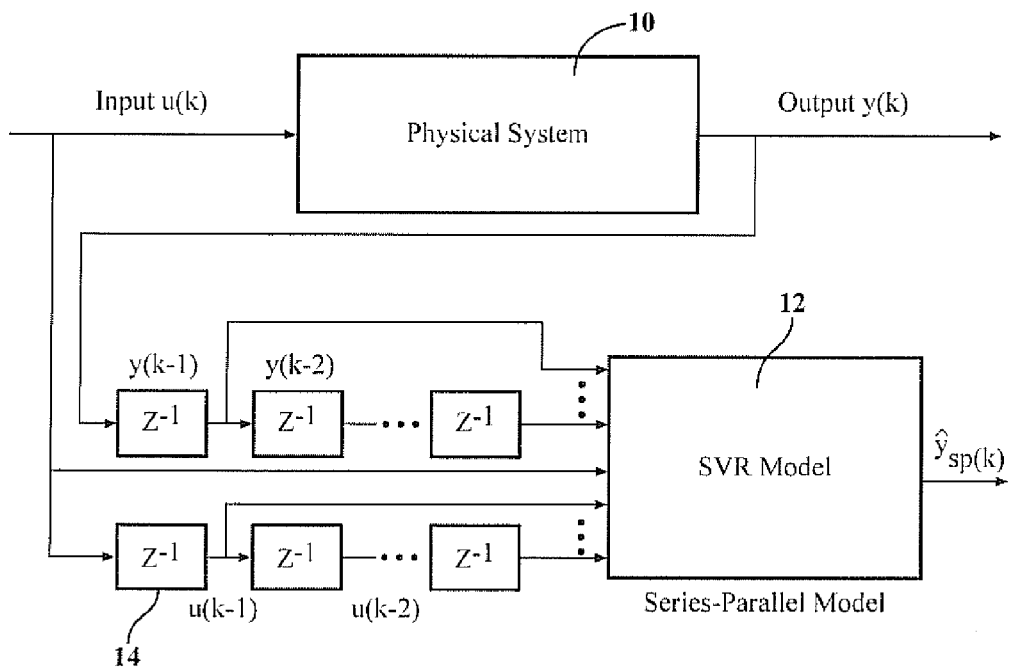
FIG. 4 shows a series-parallel model.

In a series-parallel model, the past values of the input and the output of the system form the regression vector to the identification model, whose output ŷ(k) corresponds to the estimate of the plant output at any instant of time k. FIG. 4, discussed in more detail later, shows a series-parallel model configuration in which the output from the physical system 10 forms part of the model input.

Model identification in series-parallel configuration is also called an external dynamicals strategy, as the nonlinear dynamical model can be clearly separated into two parts: a nonlinear static approximator and an external dynamical filter bank. A restrictive constraint for identification in series-parallel configuration is that the process output must be measurable during operation, i.e., the external dynamicals have to be used. This limits the usefulness and applications of a model developed and implemented in the series-parallel configuration.

In contrast, the regression vector of the parallel model comprises the past values of the output of the identification model. Without coupling to the real physical system, a nonlinear parallel model is essentially a feedback system. Using various conventional symmetric kernels, the inferiority in modeling performance compared to the series-parallel counterpart was observed.

Figure 3:
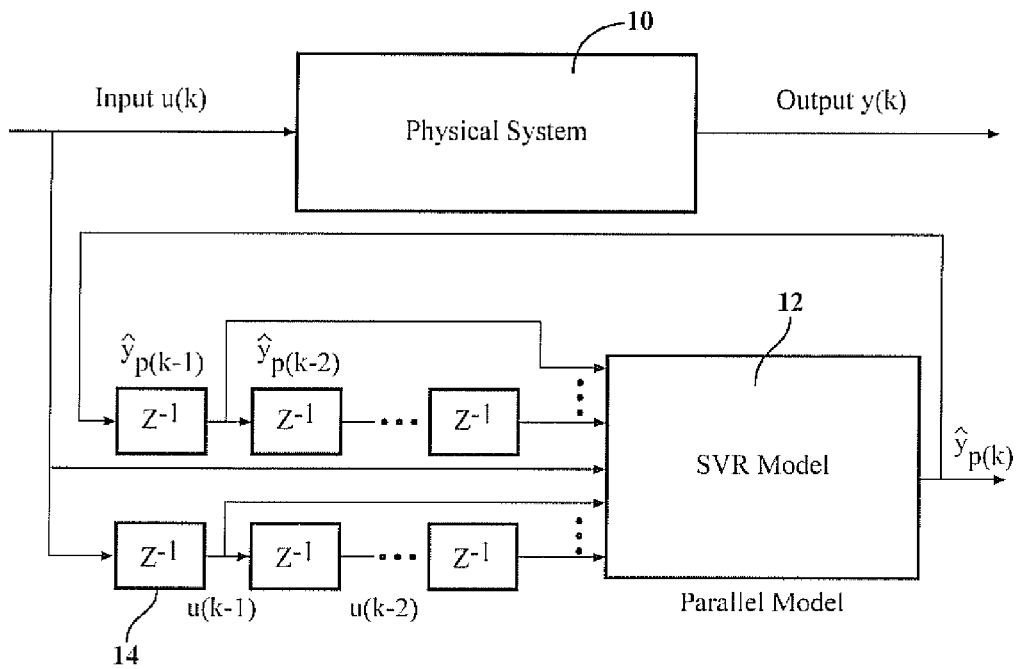
FIG. 3 shows a parallel model.

A parallel model, using internal dynamicals, can be used off-line when measurements of the system output are unavailable during system operation. Hence, the parallel model offers more flexibility in operation. FIG. 3, discussed in more detail later, shows a parallel model configuration in which the output state of the SVR model 12 forms part of the model input. This may advantageously be represented by an asymmetric wavelet kernel.

Series-parallel model error is usually called equations error, and parallel model error is known as output error. The external dynamicals strategy is by far the most frequently applied nonlinear dynamical system identification approach because of its ease in optimizing the parameters. However, it has rarely been used to train a model used in parallel configuration.

However, many applications, e.g. fault detection and diagnosis, predictive control, simulation, and the like, require a parallel model, since a prediction of many steps into the future is needed. Some earlier endeavors have been devoted to identifying the nonlinear dynamical systems in parallel model configuration, such as dynamical back-propagation (DBP) and back-propagation-through-time (BPTT) algorithm, where the tedious and time-consuming gradient calculations have to be carried out.

In the realm of nonlinear systems identification, there has been general consensus that one of the most formidable technical challenges is how to identify the parallel model of a nonlinear dynamical system, which appears much more complicated than the problem of parallel-series model identification due to the feedback involved.

Examples of the present invention, for the first time, allow an SVR model to be trained in series-parallel configuration, then used in parallel configuration for modeling the physical system. The system, in some examples, may be an engine.

The model may be trained in a series-parallel configuration during a training process, and then implemented in a parallel configuration.

In some examples, a composite kernel is used. An example composite kernel includes two kernel functions, for example as discussed below in relation to Equation 14. At least one kernel of the composite kernel is an asymmetric wavelet kernel, for example a wavelet kernel derived from a raised-cosine wavelet. An asymmetric raised-cosine wavelet kernel allows improved transient capture, as shown during simulations.

An example composite kernel includes a first kernel that is an asymmetric wavelet kernel, and this kernel represents either the current model output state (parallel mode) or the system output state (series-parallel mode). A second kernel represents the system input state in either parallel or series-parallel mode.

For the first time, an SVR model was trained in the series-parallel mode, and validated in parallel mode.

The LP-SVM-ARMA$_{2K}$ Algorithm

The LP-SVM-ARMA$_{2K}$ algorithm is described in Z. Lu, J. Sun, and K. Butts, "Linear programming SVM-ARMA$_{2K}$ with application in engine system identification," *IEEE Trans. Automation Science and Engineering*, 8(4), 846-854 (2011). A brief review is given here. The following generic notations are used herein: non-boldface symbols such as x, α, C, ... refer to scalar valued objects, lower case boldface symbols such as x, y, β, ... refer to vector valued objects, and capital boldface symbols such as $K_1$, $K_2$, ..., are used for matrices.

Consider two discrete-time processes (DTP), $\{u_n\}$ and $\{y_u\}$, which are the input and the output, respectively, of a nonlinear system. For dynamical systems, the vectors $y_{n-1} = [y_{n-1}, y_{n-2}, \ldots, y_{n-P}]^T$ and $u_n = [u_n, u_{n-1}, \ldots, u_{n-Q+1}]^T$ denote the states of the output and input DTPs at time instant n. Hence, $z_{n-1} = [y_{n-1}^T, u_n^T]^T$ is the vector concatenation of the output and input states at that instant. It is assumed that P and Q, the dimension of the vectors $y_{n-1}$ and $u_n$ respectively, are large enough so that the predictable part of the process is completely captured.

To identify the nonlinear dynamical systems described by $$y_n = f(y_{n-1}, u_n) \quad (1)$$

most of the existing approaches employ the regressor $z_{n-1}$, in which the ARMA model is considered in a wide and implicit sense. Instead of stacking the AR and MA components together into the regressor, SVM-ARMA$_{2K}$ admits the following model representation for dynamical systems identification $$\hat{y}_n = f_{AR}(y_{n-1}) + f_{MA}(u_n) \quad (2)$$

$$= \sum_{i=1}^{N} \beta_i (k_1(y_{n-1}^i, y_{n-1}) + k_2(u_n^i, u_n))$$

where $k_1$ and $k_2$ are the kernel functions for the auto-regression part $y_{n-1}$ and moving-average part $\mu_n$ respectively and the summation $k_1 + k_2$ is referred to as a composite kernel (M. Martinez-Ramon et al., "Support vector machines for nonlinear kernel ARMA system identification", *IEEE Trans. Neural Networks*, 17: 1617-1622, 2006.) As a non-parametric model, the SVM-ARMA$_{2K}$ model representation (2) is a composite kernel expansion on all of the training data. Herein, in an attempt to control the complexity of the model representation and therefore secure excellent generalization capability, the $l_1$ norm of the coefficients vector of the composite kernel expansion is employed as the regularization term in the objective function to be minimized, which usually leads to the small cardinality of the support vector subset. In this way, the non-parametric model (2) can be synthesized by solving the following regularization problem $$\text{minimize } R_{reg}[f] = \sum_{n=1}^{N} L(y_n - \hat{y}_n) + \gamma \|\beta\|_1 \quad (3)$$

where $\beta=[\beta_1, \beta_2, \ldots, \beta_N]^T$ is composite kernel expansion coefficients vector and $L(\bullet)$ is defined as the $\epsilon$—insensitive loss function $$L(y_n - \hat{y}_n) = \begin{cases} 0, & \text{if } |y_n - \hat{y}_n| \leq \varepsilon \\ |y_n - \hat{y}_n| - \varepsilon, & \text{otherwise.} \end{cases} \quad (4)$$

The vector pairs $[y_{n-1}^i, u_n^i]$ in model representation (2) corresponding to the non-zero coefficients $\beta_i$ are defined as support vectors in SVM-ARMA$_{2K}$. Several widely-used kernel functions are available for constructing the composite kernels, such as the following:
the Gaussian radial basis function (GRBF) kernel $$k(x, y) = \exp\left(\frac{-\|x - y\|^2}{2\sigma^2}\right), \quad (5)$$

the polynomial kernel $$k(x,y)=(1+\langle x,y \rangle)^q, \quad (6)$$

the sigmoid kernel $$k(x,y)=\tan h(\alpha\langle x,y \rangle +\gamma), \quad (7)$$

and the inverse multi-quadric kernel $$k(x, y) = \frac{1}{\sqrt{\|x - y\|^2 + c^2}}, \quad (8)$$

where $\sigma, q, \alpha, \gamma, c$ are the adjustable parameters of the above kernel functions. The GRBF kernel and inverse multi-quadric kernel are in the class of translation-invariant kernels, and the polynomial kernel and sigmoid kernel are examples of rotation invariant kernels.

By introducing the slack variables $\xi_n$, the regularization problem (3) can be transformed into the following equivalent optimization problem:

$$\text{minimize } \|\beta\|_1 + C\sum_{n=1}^{N} \xi_n \quad (9)$$

subject to $$\begin{cases} y_n - \sum_{i=1}^{N} \beta_i(k_1(y_{n-1}^i, y_{n-1}) + k_2(u_n^i, u_n)) \leq \varepsilon + \xi_n \\ \sum_{i=1}^{N} \beta_i(k_1(y_{n-1}^i, y_{n-1}) + k_2(u_n^i, u_n)) - y_n \leq \varepsilon + \xi_n \\ \xi_n \geq 0, \quad n = 1, 2, \ldots, N \end{cases}$$

where $\epsilon$ is the error tolerance, and the constant C>0 determines the trade-off between the sparsity of the model and the amount up to which deviations larger than $\epsilon$ can be tolerated. In other words, the calculation of the expansion coefficients vector $\beta$ and the selection of the support vectors in (2) can be accomplished by solving the optimization problem (9). For the purpose of converting the optimization problem above into a linear programming problem, the components of the coefficient vector $\beta_i$ and their absolute values $|\beta_i|$ are decomposed as follows:

$$\beta_i = \alpha_i^+ - \alpha_i^-, \quad |\beta_i| = \alpha_i^+ + \alpha_i^- \quad (10)$$

where $\alpha_i^+, \alpha_i^- \geq 0$. The decompositions in (10) are unique, i.e., for a given $\beta_i$ there is only one pair $(\alpha_i^+, \alpha_i^-)$ fulfilling both equations. Both variables cannot be positive at the same time, i.e. $\alpha_i^+ \cdot \alpha_i^- = 0$. In this way, the optimization problem (9) can be written as $$\text{minimize } \sum_{i=1}^{N}(\alpha_i^+ + \alpha_i^-) + C\sum_{n=1}^{N} \xi_n \quad (11)$$

subject to $$\begin{cases} \sum_{i=1}^{N}(\alpha_i^+ - \alpha_i^-)(k_1(y_{n-1}^i, y_{n-1}) + k_2(u_n^i, u_n)) - \xi_n \leq \varepsilon + y_n \\ -\sum_{i=1}^{N}(\alpha_i^+ - \alpha_i^-)(k_1(y_{n-1}^i, y_{n-1}) + k_2(u_n^i, u_n)) - \xi_n \leq \varepsilon - y_n \\ \xi_n \geq 0, \quad n = 1, 2, \ldots, N \end{cases}$$

Next, define the vector $$c = \left(\underbrace{1, 1, \ldots, 1}_{N}, \underbrace{1, 1, \ldots, 1}_{N}, \underbrace{C, C, \ldots, C}_{N}\right)^T \quad (12a)$$

and express the $l_1$ norm of $\beta$ as $$\|\beta\|_1 = \left(\underbrace{1, 1, \ldots, 1}_{N}, \underbrace{1, 1, \ldots, 1}_{N}\right)\begin{pmatrix} \alpha^+ \\ \alpha^- \end{pmatrix} \quad (12b)$$

with $\alpha^+ = (\alpha_1^+, \alpha_2^+, \ldots, \alpha_N^+)^T$ and $\alpha^- = (\alpha_1^-, \alpha_2^-, \ldots, \alpha_N^-)^T$, the optimization problem (11) can be formulated as the linear programming problem as follows $$\text{minimize } c^T \begin{pmatrix} \alpha^+ \\ \alpha^- \\ \xi \end{pmatrix} \quad (13)$$

subject to $$\begin{cases} \begin{pmatrix} K_1 + K_2 & -(K_1 + K_2) & -I \\ -(K_1 + K_2) & K_1 + K_2 & -I \end{pmatrix} \cdot \begin{pmatrix} \alpha^+ \\ \alpha^- \\ \xi \end{pmatrix} \leq \begin{pmatrix} y + \varepsilon \\ \varepsilon - y \end{pmatrix} \\ \alpha^+, \alpha^- \geq 0, \xi \geq 0 \end{cases}$$

where $\xi=(\xi_1, \xi_2, \ldots, \xi_N)^T$ and I is an N×N identity matrix. The $K_1$ and $K_2$ are the kernel matrices with entries defined as $(K_1)_{ij}=k_1(x_i, x_j)$, $(K_2)_{ij}=k_2(x_i, x_j)$. By solving the linear programming problem (13), the model (2) can be built for the purpose of identifying nonlinear dynamical systems.

Asymmetric Wavelet Kernel

As the cornerstone of nonlinear support vector learning algorithm, the kernel functions play an essential role in providing a general framework to represent data. For identifying the nonlinear dynamical system using the LP-SVM-ARMA$_{2K}$ algorithm, a composite kernel comprising of two heterogeneous kernels $k_1(y_{n-1}^i, y_{n-1})$ and $k_2(u_n^i, u_n)$ was specified. When running the model in parallel configuration, i.e., $$\hat{y}_n = f_{AR}(\hat{y}_{n-1}) + f_{MA}(u_n) \qquad (14)$$
$$= \sum_{i=1}^{N} \beta_i(k_1(y_{n-1}^i, \hat{y}_{n-1}) + k_2(u_n^i, u_n))$$

a kernel $k_1(y_{n-1}^i, y_{n-1})$ which excels in capturing the transient component from data is desired.

The Morlet wavelet in the form of $$\psi(x) = \cos(ax)\exp\left(-\frac{x^2}{2}\right) \qquad (15)$$

has been used to construct the translation-invariant kernel function to match the rapid changes of signals. However, the Morlet wavelet is nothing more than a sine (cosine) wave multiplied (modulated) by a Gaussian envelope, and the Morlet wavelet does not have compact support and also does not come from a multi-resolution analysis.

An innovative asymmetric wavelet kernel induced from type-II raised-cosine wavelet function was developed. As in harmonic analysis signal reconstruction technology, the raised-cosine scaling function (father wavelet function) is constructed from its power spectrum (spectrogram). The power spectrum of the raised-cosine function is defined as:

$$|\hat{\varphi}(\omega)|^2 = \begin{cases} 0, & |\omega| \geq \pi(1+b) \\ \frac{1}{2}\left(1+\cos\frac{|\omega|-\pi(1-b)}{2b}\right), & \pi(1-b) < |\omega| < \pi(1+b) \\ 1, & |\omega| \leq \pi(1-b) \end{cases} \qquad (16)$$

where $\hat{\varphi}(\omega)$ is the Fourier transform of the scaling function $\varphi(x)$, i.e., $$\hat{\varphi}(\omega) = \int_{-\infty}^{\infty} \varphi(t) e^{-i\omega t} dt \qquad (17)$$

It follows from (16) that one example of the spectrum of the raised cosine scaling function can be expressed as a complex square root $$\hat{\varphi}(\omega) = \begin{cases} 1, & 0 \leq |\omega| \leq \pi(1-b) \\ \frac{1}{2}\left[1+\exp i\left(\frac{|\omega|-\pi(1-b)}{2b}\right)\right], & \pi(1-b) \leq |\omega| \leq \pi(1+b) \\ 0, & |\omega| \geq \pi(1+b) \end{cases} \qquad (18)$$

Using the inverse Fourier transform, the scaling function $\varphi(x)$ can be found from (18) as $$\varphi(x) = \frac{\sin\pi(1-b)x + \sin\pi(1+b)x}{2\pi x(1+2bx)} \qquad (19)$$

which is called a type-II raised cosine scaling function, where b is a parameter.

Figure 1:
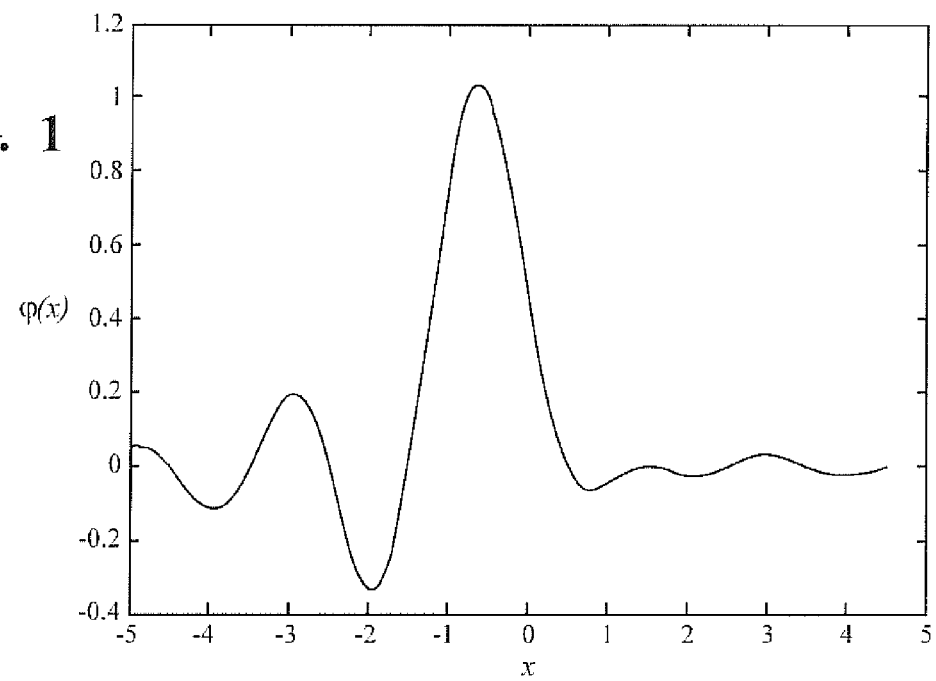
FIG. 1 shows a Type-II raised cosine scaling function.

FIG. 1 shows the type-II raised cosine scaling function of (19). The type-II raised cosine scaling function $\varphi(x)$ is not an even function, i.e., it is asymmetric. A concise approach to calculate the (mother) wavelet function from type-II raised-cosine scaling function $\varphi(x)$ is to use the following theorem, proved in G. G. Walter, X. Shen, *Wavelets and other orthogonal systems*, $2^{nd}$ Edition, Chapman & Hall/CRC, 2000.

Theorem. Let $\wp$ be the set of all $g \in L^1(R)$ such that $$g(\omega) \geq 0,$$
$$\text{supp } g \in [-\varepsilon, \varepsilon],$$
$$g(-\omega) = g(\omega), \text{ and}$$
$$\int_{-\varepsilon}^{\varepsilon} g(\omega) d\omega = \pi \text{ for some } 0 < \varepsilon \leq \frac{\pi}{3}$$

For each $g \in \wp$, the function $\varphi(x)$ defined by its spectrum $$\hat{\varphi}(\omega) = \frac{1}{2} + \frac{1}{2}\exp i\theta(\omega), \qquad (20)$$

where $$\theta(\omega) = \int_{-\omega-\pi}^{\omega-\pi} g(\xi) d\xi \qquad (21)$$

is a real band-limited orthonormal cardinal scaling function, and the corresponding mother wavelet $\psi(x)$ is given by $$\psi(x) = 2\varphi(2x-1) - \varphi(\frac{1}{2}-x). \qquad (22)$$

The spectrum $\hat{\varphi}(\omega)$ of the type-II raised cosine scaling function in equation (18) can be expressed in the form of (20). Hence, the type-II raised-cosine wavelet function $\psi(x)$ is as follows $$\psi\left(x+\frac{1}{2}\right) = \frac{1}{2\pi x[1+4bx]}[\sin 2\pi(1-b)x + \sin 2\pi(1+b)x] - \frac{1}{2\pi x[1-2bx]}[\sin\pi(1-b)x + \sin\pi(1+b)x] \qquad (23)$$

Figure 2:
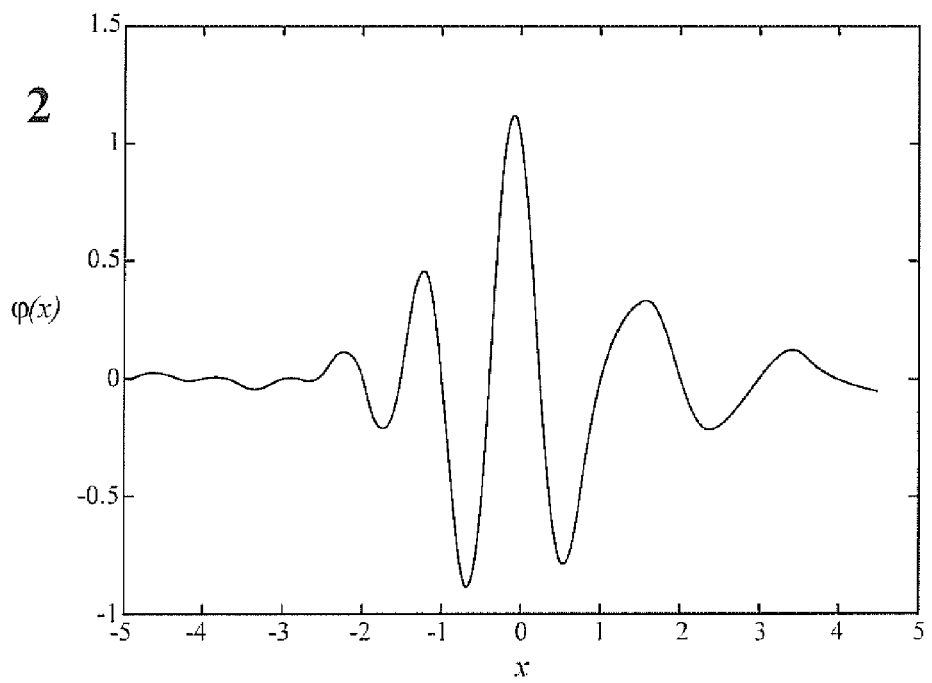
FIG. 2 shows a Type-II raised cosine wavelet function.

FIG. 2 illustrates the type-II raised-cosine wavelet function (23), which, similar to the type-II raised-cosine scaling function (19), is also an asymmetric function.

Further, for modeling the multivariable processes, the multi-dimensional type-II raised cosine wavelet basis can be defined by using the tensor product as follows $$\Psi_j\left(\begin{bmatrix} x_1 \\ \vdots \\ x_n \end{bmatrix}\right) = \prod_{k=1}^{n} \psi\left(\frac{x_k - m_{jk}}{d_j}\right) \qquad (24)$$

where $$m_j = [m_{j1}, m_{j2}, \ldots, m_{jn}]^T \qquad (25)$$

is the translation vector and $d_j$ is the dilation factor, respectively. Based on the multi-dimensional tensor product wavelet basis, the asymmetric type-II raised cosine wavelet kernel can be defined as follows $$k(x, x_i) = \prod_{k=1}^{n} \psi\left(\frac{x_k - x_{ik}}{d}\right). \qquad (26)$$

which is an asymmetric translation-invariant kernel and $x = [x_1, x_2, \ldots, x_n]^T$ is the input vector and $x_i = [x_{i1}, x_{i2}, \ldots, x_{in}]^T$ are the translation vectors, identical to the support vector. For this kernel, the dilation factor d is the only parameter that needs to be set.

Simulation

The modeling of hydraulic robot arm dynamicals has been posed as a benchmark problem for nonlinear systems identification, which was used widely for testing various identification strategies. For the hydraulic robot arm dynamical system, the control input $\mu_n$ represents the size of the valve through which oil flow into the actuator, and the output $y_n$ is a measure of oil pressure which determines the robot arm position. The regressor $$z_{n-1} = [y_{n-1}^T, u_n^T]^T \qquad (27)$$

where $y_{n-1} = [y_{n-1}, y_{n-2}, y_{n-3}]^T$ and $u_n = [u_{n-1}, u_{n-2}]^T$, was used for our simulation.

FIG. 3 shows the parallel model to be identified is $$\hat{y}_n = f(\hat{y}_{n-1}, \hat{y}_{n-2}, \hat{y}_{n-3}, u_{n-1}, u_{n-2}) \qquad (28)$$

The figure shows the system 10, having a system input state (on the left, as shown) and a system output state, an SVR model 12, corresponding to representations determined from the system input and output states. The input and output states of the nonlinear system 10 are two discrete-time processes (DTP), represented by u(k) and y(k) respectively. In the parallel model configuration, the system and model are parallel with respect to u(k) and also with respect to y(k).

FIG. 4 shows the training procedure conducted in the series-parallel model configuration. In the series-parallel model configuration, the system and model are parallel with respect to u(k) but in series with respect to y(k).

The model validation procedure is carried out in the parallel configuration as shown in FIG. 3. Half of the data set, containing 511 training data pairs, was used for training, and half was used as validation data. The approximation accuracies on training and validation data sets are evaluated by calculating the root mean square (RMS) error $$E_{RMS} = \sqrt{\frac{1}{M} \sum_{n=1}^{M} [\hat{y}_n - y_n]^2} \qquad (29)$$

where $\hat{y}_n$ the output from the trained model and M is the number of data in the data set. The model sparsity is measured by the ratio of the number of support vectors to the number of training data points, which is an important performance index for complexity and generalization capability of the model.

For training the series-parallel model via the algorithm of LP-SVM-ARMA2K, the filtered output vector $y_{n-1}$ and the filtered input vector $u_n$ in the regressor defined by (27) are fed into the kernels $k_1$ and $k_2$ of model (2) respectively. The asymmetrical type-II raised cosine wavelet kernel is employed as $k_1$ for filtered output, and the B-spline kernel is adopted for $k_2$ for filtered input. The B-spline function represents a particular example of a convolutional basis and can be expressed explicitly as $$B_l(x) = \frac{1}{l!} \sum_{r=0}^{l+1} \binom{l+1}{r} (-1)^r \left(x + \frac{l+1}{2} - r\right)_+^l, \qquad (30)$$

where the function $(\bullet)_+$ is defined as the truncated power function, i.e., $$x_+ = \begin{cases} x, & \text{for } x > 0 \\ 0, & \text{otherwise.} \end{cases}$$

Analogous to the definition of multi-dimensional wavelet kernel in (26), the multi-dimensional B-spline kernel can also be constructed by using the tensor product as follows $$k_2(x, x_i) = \prod_{k=1}^{n} B_{2J+1}(x_k - x_{ik}), \qquad (31)$$

where $x = [x_1, x_2, \ldots, x_n]^T$ and $x_i = [x_{i1}, x_{i2}, \ldots, x_{in}]^T$. Apparently, the B-spline kernel defined by (31) is also a translation-invariant kernel, and J is the only parameter.

Figure 5:
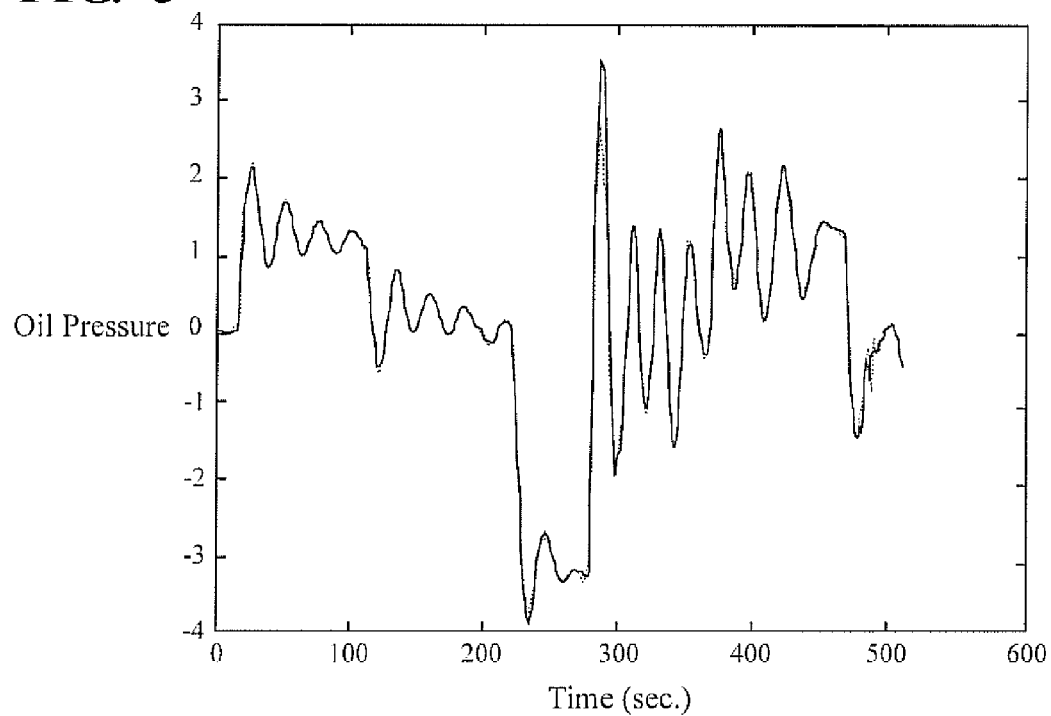
FIG. 5 shows training in series-parallel configuration (solid line: system output; dotted line: output from the model)
Figure 6:
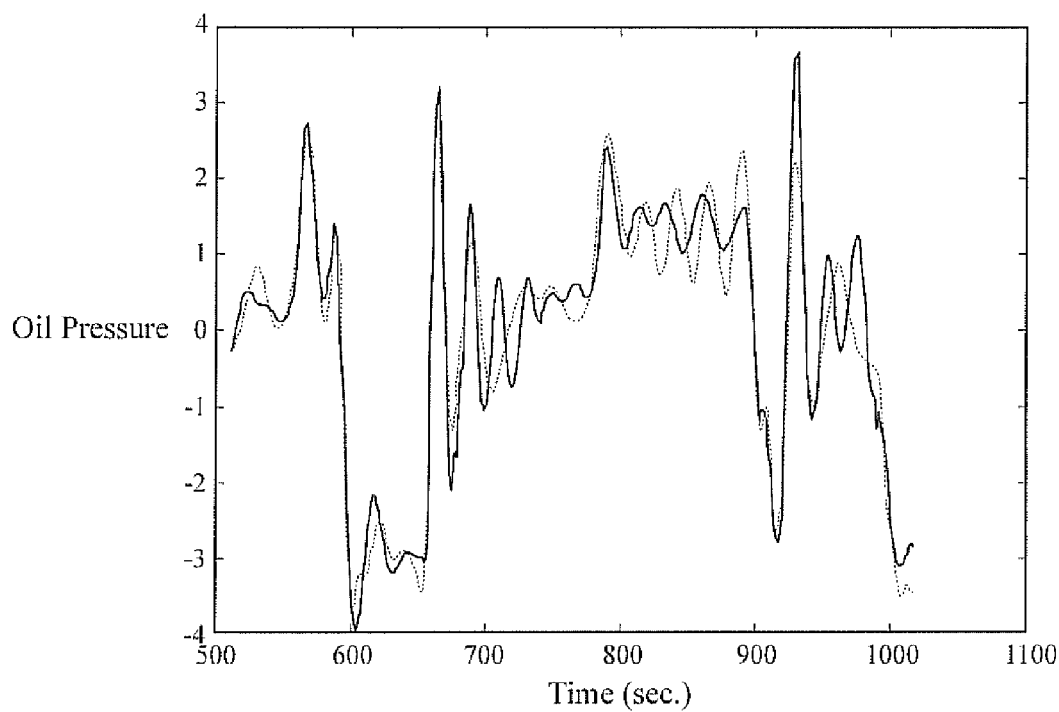
FIG. 6 shows validation in parallel configuration (solid line: system output; dotted line: output from the model)

FIGS. 5 and 6 show the training and validation results obtained from the simulation described above. FIG. 5 shows training in series-parallel configuration (solid line: system output; dotted line: output from the model), and FIG. 6 shows validation in parallel configuration (solid line: system output; dotted line: output from the model).

In the simulation, learned by the algorithm of LP-SVM-ARMA$_{2K}$, the sparsity of the obtained kernel expansion model given by equation (2) is 4.3%, and the RMS training error on training data set is 0.1425. For prediction on the validation dataset in parallel configuration, the RMS prediction error is 0.4613. This parallel model validation accuracy is even better than some of those obtained in series-parallel configuration by some popular learning strategies, such as RMS error 0.467 from one-hidden-layer sigmoid neural network, or RMS error 0.579 from wavelet networks (J. Sjöberg et al., "Nonlinear black-box modeling in system identification: a unified overview," *Automatica*, 31: 1691-1724, 1995.)

Applications

Applications of examples of the present invention include modeling of dynamical systems, such as process control, including chemical, physical, robotic and/or mechanical process control. For example, an improved robot controller can be configured to use LP-SVR models using asymmetric wavelet kernel, for modeling actuator response. Applications further include image analysis (such as image cataloging, object recognition such as face detection, and the like), voice recognition, and computationally demanding applications. A particular application is engine management and control applications.

Vehicles, such as automobiles, often include an electronic control unit (ECU) for engine control. The ECU receives engine data from various engine sensors, and uses the engine data and an engine model to modify engine operational parameters. Engine sensors providing engine data may include a throttle position sensor, oxygen sensor, manifold absolute pressure (MAP) sensor, air temperature sensor, coolant temperature sensor, and the like. Engine parameters controlled by an ECU may include fuel injection quantities, ignition timing, variable valve timing (VVT), turbocharger boost (if applicable), and the like. In a typical example, the throttle position sensor provides a throttle position signal as part of the engine data received by the ECU, which in response increases the fuel injection quantities.

Engine operation is enhanced by using an ECU that uses an accurate model of engine operation. However, the number of model parameters may become large, so that the computing power necessary to set up (train) and run the model becomes substantial, particularly using conventional approaches. Engine operation is a dynamical process and response to transient data may need to be substantially immediate, such as less than a second. Operator inputs (such as throttle position) are received by the ECU, and result in control of engine operation parameters (such as fuel injection quantity). There may also be adverse safety consequences if an engine model used does not readily allow the ECU to detect or respond quickly to transient data. Hence, dynamical modeling methods using an SVM with wavelet kernel described herein are particularly useful for engine control applications.

Applications include an improved control unit for a complex physical system, such as an improved electronic control unit (ECU) for a vehicle engine, the SVM providing a model of engine performance. The model used in the control unit can be adapted as the system ages, or other systems variations detected. Comparison of the model predictions with actual performance, which can be performed on-line using a sliding window of data, allow system (e.g. engine) changes to be detected and the model parameters to be recalibrated. The control unit may be reprogrammed through retraining of the SVM using collected system (e.g. engine) data. Diagnostic outputs may be obtained from a comparison of the model and actual system performance.

Figure 7:
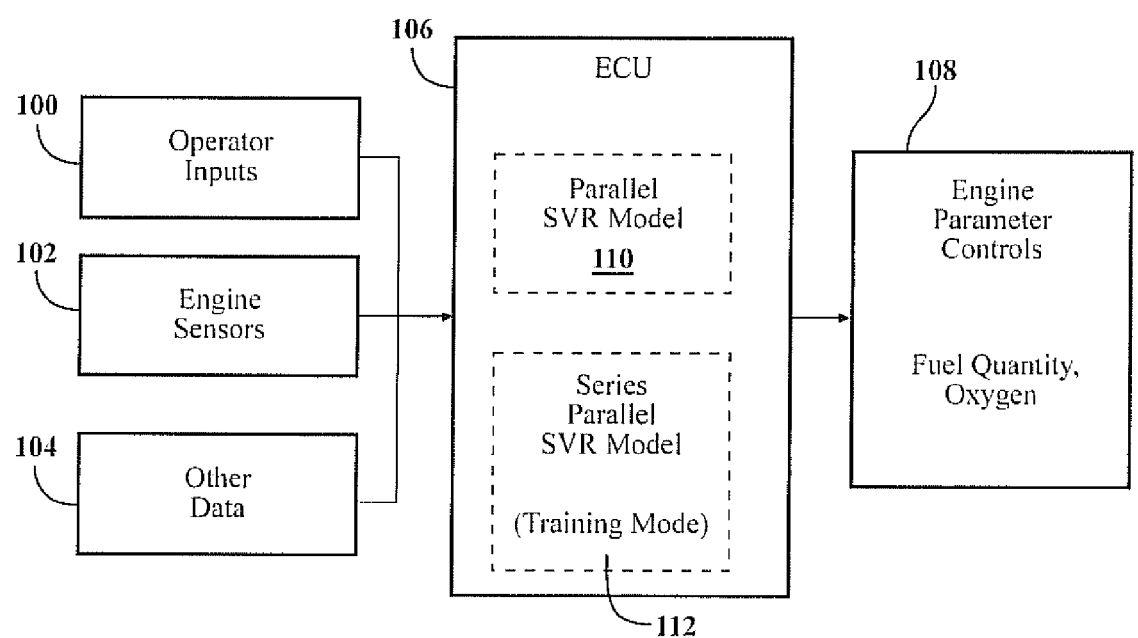
FIG. 7 shows an example of an engine electronic control unit (ECU).

FIG. 7 is a simplified schematic of an engine control system, comprising sources of engine data such as one or more operator input sensors 100 (such as a throttle position sensor), engine operation sensors 102 (such as a coolant temperature sensor, fuel flow sensor, rpm sensor, and the like), and optional other data sources 104, such as signals from an automatic cruise control system. Engine data is provided to the ECU 106, and the ECU uses an SVR model of the engine to provide control outputs to engine parameter controls 108 (such as fuel flow or quantity controls). The SVR engine model is implemented within the ECU (or otherwise in communication with the ECU), for example as a software algorithm executed by a processor. The SVR model uses an asymmetric wavelet kernel, as described herein. An error calculation module may be included to monitor the accuracy of the model, for example by comparing predicted engine behavior and actual response to engine parameter controls.

Possible ECU functional modules are represented by dashed boxes 110 and 112 in the figure, and here correspond to the parallel and series-parallel configurations of the SVR model executable by a processor within the ECU. The ECU may further include a clock and allow rolling time gated storage of data in memory. Model parameters may be stored in non-volatile memory.

Data from a sliding time window may be stored in a memory within the ECU and used for comparison with the SVR model. A linear programming algorithm may be used to retrain the SVR model if errors are above a threshold value, for example optimizing model parameters using stored data. The training may be performed in series-parallel mode, and may be achieved during normal operation of the vehicle.

For a new vehicle engine, SVM model parameters may be determined from engine testing using the model structure developed for the same type of engine. However, these trained parameter values may become less accurate as the engine wears. Hence, the model can be adjusted based on a comparison of model predictions and actual observed engine performance. This allows individual vehicle optimization of engine performance. The optimized model parameters may further be used as diagnostic of engine condition.

Hence, embodiments of the present invention allow improved engine behavior modeling as a function of adjustable engine parameters. An electronic control unit for an engine can use an SVM-based engine model to improve engine performance. In some examples, improved engine modeling allows engine performance to be optimized in relation to one or more goals, such as exhaust emission reduction, fuel economy enhancement, acceleration, or other engine performance metric.

An SVR model can be used to model any dynamical process, and is particularly well suited to engine management applications. Conventional modeling approaches, such as the use of look-up tables, are not adaptive, often use steady state operation to generate the model, and hence often do not properly describe transient behavior (non-steady state behavior) of the engine. In contrast, engine modeling according to embodiments of the present invention provides improved representation of transient engine performance data, particularly in parallel mode. Training of an engine model may use data-rich transient operation, and on-line training is possible during normal operation of the vehicle.

Embodiments of the present invention may be used for other types of modeling, in particular modeling of any type of complex multi-input, multi-output nonlinear systems. Sparsity of the generated model facilitates real-time computation and on-line model adaptability. Embodiments of the present invention include modeling of transient responses in complex systems.

An example method of providing a model of a nonlinear system includes providing an SVR model having an asymmetric wavelet kernel, providing training data to the SVR model in series-parallel mode to determine model parameters using a linear programming, algorithm, and operating the model in parallel mode to improve dynamical performance of the model. The SVR model may be used to control a vehicle engine, the support vector machine providing a model of engine performance. Training data and optimized model parameters may be determined during an engine test process, and optimized model parameters may be determined in an engine model used by an electronic control unit for a similar engine.

A method of modeling of a nonlinear system includes providing a model of the nonlinear system using linear programming support vector regression (LP-SVR) using an asymmetric wavelet kernel, training the model in a series-parallel configuration, and operating the model in a parallel configuration.

The model may be trained by determining a predicted system performance using the support vector machine; determining a modeling error by comparing the predicted system performance with actual system performance over a time period; and retraining the support vector machine if the modeling error is greater than a threshold value. Retraining the model may use a linear programming method to determine model parameters from collected system data, wherein the model of the nonlinear system is maintained in an optimized condition even if the nonlinear system changes.

The nonlinear system may be an engine, such as a vehicle engine, and in particular an automobile engine. Engine data may include one or more of the following; coolant temperature data, throttle position data, fuel injection quantity data, and valve timing data.

An improved electronic control unit for a vehicle engine comprises engine data inputs configured to receive engine data, the engine data including engine operation data and operator input data; engine control outputs, operable to control engine parameters, the engine parameters including fuel injection quantity; and an electronic control circuit. The electronic control circuit may include a processor, a memory, and other conventional support components. The electronic circuit is configured to provide an engine model using support vector machine with an asymmetric wavelet kernel, the engine model being, used to determine required engine parameters from the engine data using linear programming support vector regression (LP-SVR) with the asymmetric wavelet kernel. The engine model may be operated in series-parallel mode for training, and parallel mode for engine modeling during normal operation.

The electronic control circuit may be further operable to determine a modeling error by comparing a modeled engine performance with an actual engine performance, and to retrain the support vector machine if the modeling error is greater than a threshold value. For example, the model in parallel mode may be used for prediction several model steps into the future, and these predictions may later be compared with actual system data (where available) corresponding to one or more of these predicted steps.

Retraining the support vector machine may use a linear programming approach to determine model parameters from collected engine data. Training (and retraining) may be performed with the model configured in series-parallel configuration for the training process, the model then being configured in parallel configuration during normal operation. The model may be retrained during operation of the vehicle. Training the support vector machine may correspond to reprogramming an electronic control unit for the engine.

The invention is not restricted to the illustrative examples described above. Examples described are not intended to limit the scope of the invention. Changes therein, other combinations of elements, and other applications will occur to those skilled in the art.

Having described our invention, we claim:

1. A method of modeling a system, the system being a nonlinear dynamical system, the method comprising:
providing a model, the model being a linear programming support vector regression (LP-SVR) having an asymmetric wavelet kernel, the asymmetric wavelet kernel being derived from a raised-cosine wavelet function;
training the model to determine model parameters, the model being trained in a series-parallel configuration; and
modeling the system, using the model in a parallel configuration and the model parameters determined in the series-parallel configuration.

2. The method of claim 1, the wavelet kernel is derived from a scaling function $\phi(x)$, the scaling function being a raised-cosine scaling function $$\varphi(x) = \frac{\sin\pi(1-b)x + \sin\pi(1+b)x}{2\pi x(1+2bx)},$$

where b is a parameter.

3. The method of claim 1, the wavelet kernel using a type-II raised-cosine wavelet function $\psi(x)$, where $$\psi\left(x + \frac{1}{2}\right) = \frac{1}{2\pi x[1+4bx]}[\sin 2\pi(1-b)x + \sin 2\pi(1+b)x] - \frac{1}{2\pi x[1-2bx]}[\sin\pi(1-b)x + \sin\pi(1+b)x]$$

where b is a parameter.

4. The method of claim 3, the kernel using a multi-dimensional type-II raised cosine wavelet basis defined by a tensor product $$\Psi_j\left(\begin{bmatrix} x_1 \\ \vdots \\ x_n \end{bmatrix}\right) = \prod_{k=1}^{n} \psi\left(\frac{x_k - m_{jk}}{d_j}\right)$$

where $m_j=[m_{j1}, m_{j2}, \ldots, m_{jn}]^T$ is a translation vector and $d_j$ is a dilation factor.

5. The method of claim 4, wherein the training data and optimized model parameters are determined during an engine test process.

6. The method of claim 1, the model using a composite kernel including the asymmetric wavelet kernel and a second kernel.

7. The method of claim 6, the second kernel representing a system input state,
the asymmetric wavelet kernel representing a system output state when the model is in the series-parallel configuration,
the asymmetric wavelet kernel representing a model output state when the model is in the parallel configuration.

8. The method of claim 1, wherein the system is a vehicle engine, the model being a model of engine performance.

9. A method of modeling a system, the system being a vehicle engine, the method comprising:
providing a model, the model including linear programming support vector regression (LP-SVR) having a wavelet kernel,
the model being implemented as software on an engine electronic control unit,
the wavelet kernel being an asymmetric wavelet kernel derived from a raised-cosine wavelet function;
training the model to determine model parameters, the model being trained in a series-parallel configuration; and
modeling the system, using the model in a parallel configuration, using the model parameters determined in the series-parallel configuration.

10. The method of claim 9, the wavelet kernel is derived from a scaling function $\phi(x)$, the scaling function being a raised-cosine scaling function having the form $$\varphi(x) = \frac{\sin\pi(1-b)x + \sin\pi(1+b)x}{2\pi x(1+2bx)}$$

where b is a parameter.

11. The method of claim 9, further including retraining the model in the series-parallel configuration during operation of the vehicle, retraining including reprogramming of the engine electronic control unit.

12. An apparatus, the apparatus being an engine electronic control unit for a vehicle engine, the apparatus comprising:
engine data inputs configured to receive engine data, the engine data including engine operation data and operator input data;
engine control outputs, operable to control engine parameters, the engine parameters including fuel injection quantity; and
an electronic control circuit, the electronic control circuit comprising at least a memory and a processor, the electronic control circuit using a linear programming support vector regression (LP-SVR) having a wavelet kernel as a model of the vehicle engine, the model being used to determine required engine model from the engine data, the wavelet kernel being an asymmetric wavelet kernel derived from a raised-cosine wavelet function.

13. The apparatus of claim 12, the engine electronic control unit having a training mode and an operating mode,
the model having a series-parallel configuration when the engine electronic control unit is in the training mode,
the model having a parallel configuration when the engine electronic control unit is in the operating mode.

14. The apparatus of claim 12, wherein the engine data comprises one or more engine parameters selected from the group of engine parameters consisting of coolant temperature, throttle position, fuel injection quantity, and valve timing.

\* \* \* \* \*